United States Patent
Cohen et al.

(10) Patent No.: US 7,657,816 B2
(45) Date of Patent: Feb. 2, 2010

(54) LOW-COMPLEXITY HYBRID LDPC CODE ENCODER

(75) Inventors: Aaron E. Cohen, White Bear Lake, MN (US); Keshab K. Parhi, Maple Grove, MN (US)

(73) Assignee: Leanics Corporation, Maple Grove, MN (US)

( * ) Notice: Subject to any disclaimer, the term of this patent is extended or adjusted under 35 U.S.C. 154(b) by 697 days.

(21) Appl. No.: 11/487,063

(22) Filed: Jul. 13, 2006

(65) Prior Publication Data

US 2007/0033485 A1    Feb. 8, 2007

Related U.S. Application Data (60) Provisional application No. 60/699,171, filed on Jul. 13, 2005.

(51) Int. Cl.
*H03M 13/11*    (2006.01)
(52) U.S. Cl. ........................ 714/752; 714/757
(58) Field of Classification Search ........... 714/752, 714/757
See application file for complete search history.

(56) References Cited

U.S. PATENT DOCUMENTS

| | | | |
|---|---|---|---|
| 6,757,122 B1 * | 6/2004 | Kuznetsov et al. | 360/53 |
| 6,928,602 B2 * | 8/2005 | Yamagishi et al. | 714/781 |
| 7,313,752 B2 * | 12/2007 | Kyung et al. | 714/801 |
| 7,447,235 B2 * | 11/2008 | Luby et al. | 370/476 |
| 7,484,159 B2 * | 1/2009 | Kan et al. | 714/755 |
| 7,493,551 B2 * | 2/2009 | Berens et al. | 714/790 |
| 7,499,490 B2 * | 3/2009 | Divsalar et al. | 375/240 |
| 7,502,987 B2 * | 3/2009 | Kyung et al. | 714/781 |
| 7,559,008 B1 * | 7/2009 | Patapoutian | 714/800 |

* cited by examiner

*Primary Examiner*—Stephen M Baker (57) ABSTRACT

Encoders and methods for designing encoders for Low Density Parity Check (LDPC) and other block codes are presented. An efficient and systematic method for designing partially parallel encoders is presented. A parallelism factor is selected such that the end result for the encoder is similar to the partially parallel G matrix multiplication method. In addition to the method an initial circuit is given for the G matrix multiplication encoder and the RU encoder. A circuit for the hybrid encoder is presented which achieves less power consumption and smaller area than an equivalent encoder based on the G matrix multiplication with a smaller critical path than previous encoders.

17 Claims, 6 Drawing Sheets

Note: Dashed items are optional

Partially Parallel Low Complexity Hybrid Encoder

Figure 1 Partially parallel encoder based on G matrix multiplication

Figure 2 Approximate Lower Triangular Form for the H matrix

Figure 3 The Richardson-Urbanke (RU) Encoder for Block Codes
PRIOR ART

Figure 4 Partially Parallel Low Complexity Hybrid Encoder

Figure 5 Example 2-Parallel Back Substitution

Figure 6 Partially Parallel Low Complexity Hybrid Encoder with partially parallel back substitution

LOW-COMPLEXITY HYBRID LDPC CODE ENCODER

CROSS-REFERENCE TO RELATED APPLICATIONS

This application claims the benefit of the U.S. Provisional Application No. 60/699,171 filed Jul. 13, 2005, which is incorporated herein by reference in its entirety.

STATEMENT REGARDING FEDERALLY-SPONSORED RESEARCH AND DEVELOPMENT

This invention was made with Government support from the National Science Foundation (NSF) under Grant No. 0441632, *SBIR Phase I: Design of a* 10-*Gigabit Ethernet Transceiver Over Copper.*

FIELD OF THE INVENTION

The present invention relates to data processing, transmission, and digital communication. More specifically, it is related to encoder design for error correcting codes.

BACKGROUND OF THE INVENTION

Error correcting codes are a protection mechanism to ensure reliable transmission through noisy communication channels. The main principle of error correcting codes is to add redundancy to the information at the transmitter. This redundancy allows error detection and error correction at the receiver. Error correcting codes fall into one of several categories: block codes and tree codes. Block codes are memoryless codes whereas tree codes require memory (George C. Clark and J. Bibb Cain, *Error-Correction Coding for Digital Communications*, Plenum Press, 1981). There are several important block codes in use today such as Low Density Parity Check (LDPC), BCH, and Reed-Solomon codes. The most common tree codes are Convolutional codes. Block codes can be found in everyday products and services, where digital communication is used, like digital video, networks, hard disk drives, and satellites.

Block codes can be represented by two matrices (George C. Clark and J. Bibb Cain, *Error-Correction Coding for Digital Communications*, Plenum Press, 1981). One matrix defines the parity checks such that $Hc^T=0$ for a codeword (c) that is free of errors. This matrix is referred to as the parity check matrix (H). The other matrix is referred to as the Generator matrix (G). Together the generator matrix and the parity check matrix have the following relationship: $(HG^T=0)$. This relationship means that all codewords defined in (G) are valid codewords. Furthermore if an error occurs such that the received information is r=c+e. Then the error will generate a syndrome $Hr^T=Hc^T+He^T=He^T$ which can be used to easily detect the error locations. In a systematic code, where c=[s p] and s contains the k information values and p contains the parity vector of n-k values. Then the Generator and parity check matrices are defined as $G=[I_k\ P]$ and $H=[-P^T\ I_{n-k}]$, where P represents the parity check matrix, $I_x$ represents the identity matrix of size (x by x).

The primary challenges with error correcting codes (ECC) is achieving near optimal use of available bandwidth and minimizing encoding and decoding complexity. ECCs that achieve near optimal use of available bandwidth are said to be near the Shannon limit. Unfortunately, these codes suffer from high decoding and encoding complexity. LDPC codes fall into this category of requiring high decoding and encoding complexity to achieve near Shannon limit performance (D. J. C. MacKay and R. M. Neal, "Near Shannon limit performance of low density parity check codes," Electronic Letters, Vol. 32, pp 1645-1646, August 1996).

Recently, the near Shannon limit LDPC codes have become important to Industry. They have found their way into consumer standards such as Digital Video Broadcasting (DVB), 10 Gigabit Ethernet over copper (10GBase-T), and high speed wireless (IEEE 802.11n). The main disadvantages to using LDPC codes in these standards are 1) implementing LDPC decoders requires a significant amount of power, area, and latency and 2) implementing efficient partially parallel encoders requires a significant amount of power and area (and/or storage) overhead. Therefore, efficient implementations of LDPC codes are important.

The present invention focuses on solving problem 2) from above. LDPC encoders can be implemented in several different ways depending on the specific LDPC code. In all cases the Generator (G) matrix multiplication method is valid. Due to the higher complexity of the LDPC decoder it is often more efficient to fold the matrix multiplication operation. Unfortunately, folding the matrix multiplication looses the advantage of the sparseness of the G matrix. The Richardson-Urbanke (RU) method (T. J Richardson and R. L. Urbanke, "Efficient Encoding of Low Density Parity Check Codes", IEEE Transactions on Information Theory, Vol. 47 No. 2, February 2001) was proposed as an alternative encoder which takes advantage of the sparseness of the H matrix. Although the RU method achieves savings on implementation costs, it is primarily intended as a parallel design and suffers from high complexity when implemented in hardware. Designing partially parallel RU LDPC encoders is a challenging problem.

Low complexity block code encoders are important in minimizing the overall power consumption and area costs for digital transmitter systems. What is needed is a systematic method for designing partially parallel low complexity block code encoders (and circuits) that achieve minimal power consumption and area costs.

BRIEF SUMMARY OF THE INVENTION

The present invention provides an efficient partially-parallel implementation of block code encoders and describes a method for designing efficient partially parallel block code encoders.

In accordance with the present invention, the H matrix is transformed into a more efficient form referred to as approximate lower triangular form with a lower triangular T matrix for encoding. This form in conjunction with the G matrix forms the mathematical equations for the Hybrid encoder. The main challenge is to convert the back substitution operation into a partially parallel operation without a long critical path. The inversion and multiplication operation, with the T matrix, is modified to generate a partially parallel inversion and multiplication operation without a long critical path or significant cycle latency. There are several options for inversion and multiplication which are discussed in the present invention. Then a method is described for generating an inversion and multiplication method for partially parallel systems without sacrificing critical path or substantial storage or area overhead. This method is combined with the G matrix multiplication method such that the initial parity values that cannot be computed with the T matrix are generated in parallel or in partially parallel by the G matrix. The final encoder design yields a partially parallel encoder which requires less power and area than a partially parallel G matrix multiplication encoder.

Further embodiments, features, and advantages of the present invention, along with structure and operation of various embodiments of the present invention, are discussed in detail below with reference to the accompanying figures.

BRIEF DESCRIPTION OF THE DRAWINGS/FIGURES

The present invention is described with reference to the accompanying figures. In the figures, like reference numbers indicate identical or functionally similar elements. Additionally, the left-most digit or digits of a reference number identify the figure in which the reference number first appears. The accompanying figures, which are incorporated herein and form part of the specification, illustrate the present invention and, together with the description, further serve to explain the principles of the invention and to enable a person skilled in the relevant art to make and use the invention.

DETAILED DESCRIPTION OF THE INVENTION

Figure 1:
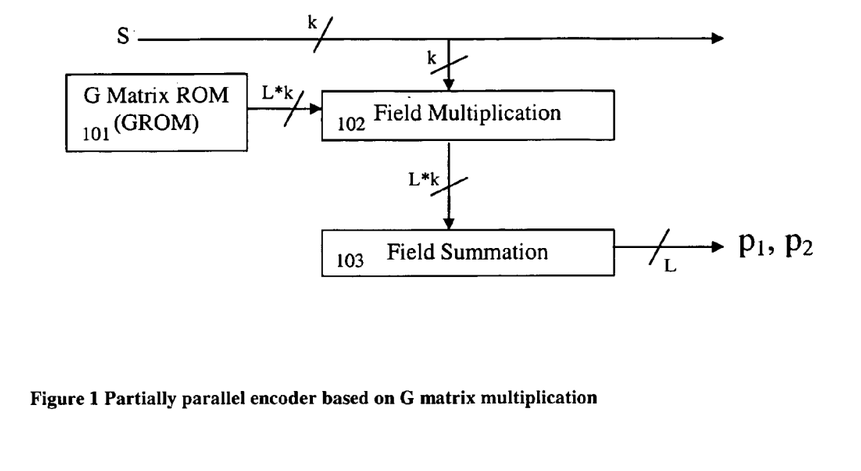
FIG. 1. illustrates a partially parallel encoder based on the Generator (G) matrix multiplication method for block codes.

Modern digital communication systems require partially parallel error correcting code encoders for efficient power utilization and minimal area consumption. The encoding process for block codes can be described by the mathematical matrix multiplication formula $c=sG=[s\ p_1\ p_2]$, where s is the input information vector, G is the generator matrix, and c is the resulting codeword vector consisting of s and the parity values vector $[p_1\ p_2]$. Although fully parallel matrix multiplication encoders are possible to implement it is more area and power efficient to implement the matrix multiplication with the circuit in FIG. 1. FIG. 1 illustrates circuit 100 the partially parallel G matrix multiplication encoder.

Circuit 100 consists of blocks 101, 102 and 103. Block 101 is the storage memory for the G matrix. In an embodiment, block 101 is a read only memory (ROM). In another embodiment, block 101 is random access memory (RAM). In other embodiments, other devices may be used. Block 102 is the field multiplication logic which multiplies the input information vector (s) by the appropriate entries in the G matrix memory. In an embodiment, block 102 consists of several logical AND gates. In other embodiments, other devices may be used such as multiplexers. Block 103 is the field summation (addition) trees which perform a summing operation over a field to generate the parity bits ($p_i$'s). In an embodiment, block 103 consists of logical exclusive or (XOR) trees. In other embodiments, other devices such as adders may be used.

Circuit 100 operates in a partially parallel manner such that if L parity values are generated per cycle then it must read L*rowsize(P) values per cycle. In a systematic code the parity values are generated in ceiling of (colsize(P)/L) cycles. The primary advantage of the G matrix multiplication encoder is that it is easily folded to generate partially parallel designs. The primary disadvantage with this encoder is it requires large storage overhead for the coefficients.

Although the G matrix multiplication method leads to simple encoder designs, it is not necessarily the most efficient in terms of computation complexity, power consumption, or area requirements. The Richardson-Urbanke (RU) encoder method uses the relationship of the information values and the parity values with the H matrix to define efficient encoding methods. The first step in the RU method is to convert the ordinary H matrix into an approximate lower triangular form as in FIG. 2.

Figure 2:
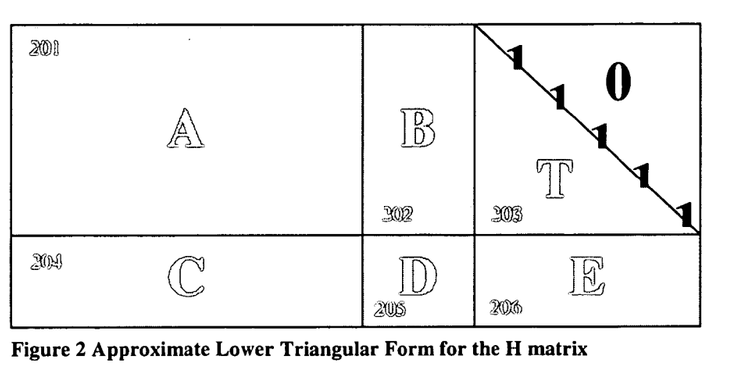
FIG. 2. illustrates approximate lower triangular form for the H matrix.

FIG. 2 illustrates block 200 the approximate lower triangular form as defined in (T. J Richardson and R. L. Urbanke, "Efficient Encoding of Low Density Parity Check Codes", IEEE Transactions on Information Theory, Vol. 47 No. 2, February 2001). Block 200 consists of blocks 201 (A), 202 (B), 203 (T), 204 (C), 205 (D), and 206 (E). The dimensions of blocks 201 to 206 are set by maximizing the size of block 203 (T) through the process of swapping entries in the original H matrix such that block 203 is lower triangular in form. In an embodiment, row swapping is used to determine the size of block 203. In another embodiment column swapping is used to determine the size. In another embodiment column additions may be used. In other embodiments, other swapping methods or addition methods or combinations may be used.

The new H matrix will now be in the following approximate lower triangular form:

$$H = \begin{pmatrix} A & B & T \\ C & D & E \end{pmatrix},$$

where T is lower triangular and $\Phi=-ET^{-1}B+D$ is non-singular (in GF(2) for LDPC codes). The next step is Gaussian elimination (which works whether T is singular or not) to yield the new H' matrix of the form:

$$H' = \begin{pmatrix} A & B & T \\ -ET^{-1}A+C & -ET^{-1}B+D & 0 \end{pmatrix}.$$

Note, if $\Phi=-ET^{-1}B+D$ is singular in GF(2) then it is necessary to swap columns to generate a non-singular matrix. (Note: swapping columns at this stage means one will need to swap columns back prior to decoding which basically makes this a non-systematic encoding approach. Another method is to perform row swapping but this may suffer from a larger $\Phi$ matrix which significantly degrades encoding performance. Richardson and Urbanke suggested using the permuted H matrix as the decoding matrix but this may lead to a less efficient decoder if the original H matrix had special properties which simplify the decoder.)

Now the new H' matrix gives us two equations to use to solve for the parity checks. Assuming codeword $c=[s\ p_1\ p_2]$ where s contains the systematic information vector and $p_1, p_2$ are parity vectors with $Hc^T=H'c^T=0$ for all valid codewords. Then the two equations are given by:

$$As^T+Bp_1^T+Tp_2^T=0$$

$$(-ET^{-1}A+C)s^T+(-ET^{-1}B+D)p_1^T+0=0.$$

The two equations above allow one to solve for the parity vectors ($p_1$, $p_2$) using only the supplied information vector (s) such that:

$$p_1^T = -\Phi^{-1}(-ET^{-1}A+C)s^T$$

$$p_2^T = -T^{-1}(As^T + Bp_1^T).$$

Figure 3:
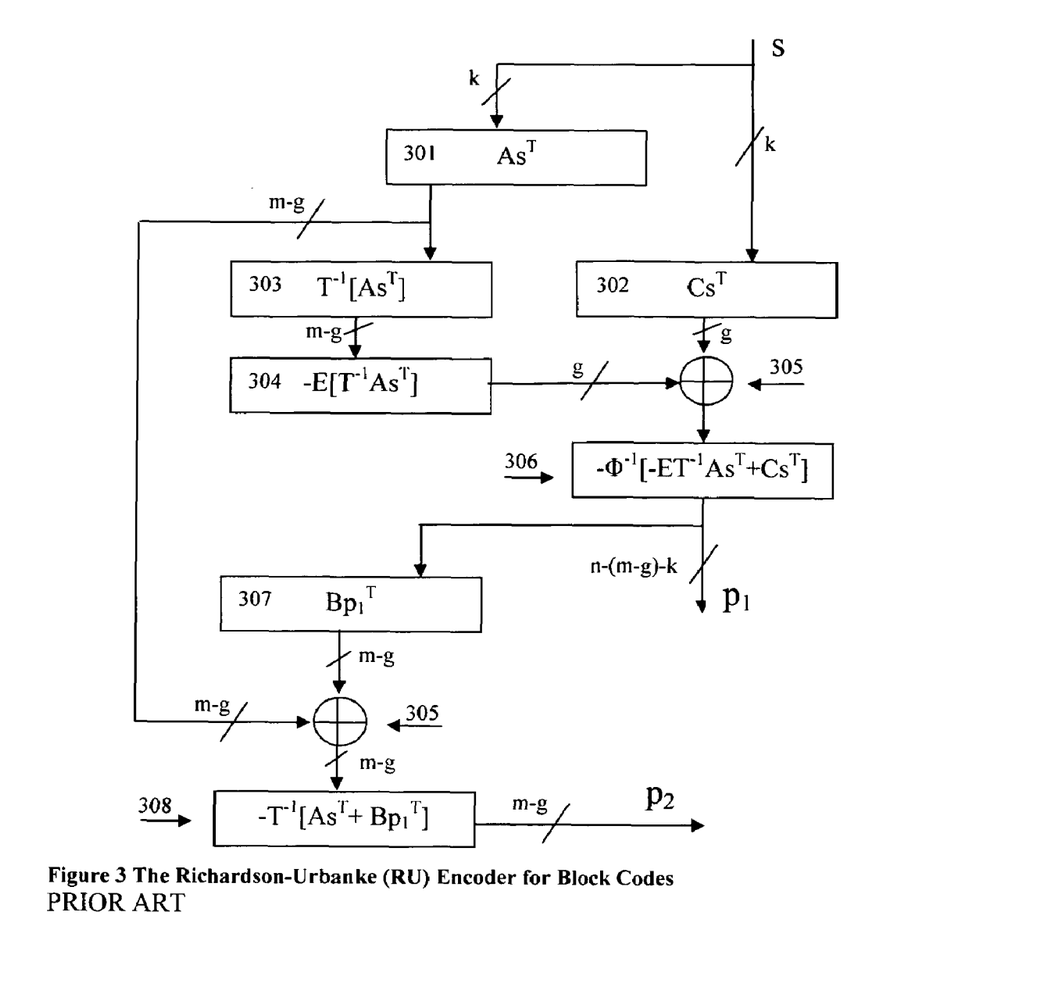
FIG. 3. illustrates the Richardson-Urbanke (RU) encoder method for block codes.

Assuming the use of pre-computation, one can perform the $p_1$ calculation with one dense matrix multiplication or several smaller sparse multiplications and one smaller dense multiplication. Similarly the $p_2$ calculation can be computed by two small sparse matrix multiplications and one back substitution or two larger and denser matrix multiplications. FIG. 3 includes an example implementation of the parallel RU encoder.

FIG. 3 illustrates circuit 300 the Richardson-Urbanke (RU) parallel encoder. Circuit 300 consists of blocks 301, 302, 303, 304, 305, 306, 307, and 308. Block 301 consists of the matrix multiplication of A (block 201) with input S. In an embodiment, block 301 is implemented as a matrix multiplication. In other embodiments, other methods may be used. Block 302 consists of the matrix multiplication of C (block 204) with input S. In an embodiment, block 302 is implemented as a matrix multiplication. In other embodiments, other methods may be used. Block 303 consists of the matrix multiplication of inverse of T (block 203) with output from block 301. In an embodiment, block 303 is implemented as matrix multiplication. In another embodiment, block 303 is implemented as back substitution. In another embodiment, block 303 is implemented using an iterative matrix inversion technique. In other embodiments, other methods may be used. Block 304 consists of the matrix multiplication—E (block 206) with the output from block 303. In an embodiment, block 304 is implemented as a matrix multiplication. In other embodiments, other methods may be used. Block 305 consists of an adding function. In one instance it adds the output of block 304 with the output of block 302. In another instance it adds the output of block 301 with the output of block 307. In an embodiment, block 305 is implemented as an array of adders. In other embodiments, other devices may be used such as logical XOR gates. Block 306 consists of the matrix multiplication of the negative of the inverse of $\Phi=(-ET^{-1}B+D)$, where E is block 206, T is block 203, B is block 202, and D is block 205. In an embodiment, block 306 is implemented as a matrix multiplication. In another embodiment, block 306 is implemented with iterative matrix inversion. In other embodiments, other methods may be used. Block 307 is matrix multiplication of block 202 with the output of block 306. In an embodiment, block 307 is implemented as a matrix multiplication. In other embodiments, other methods may be used. Block 308 is a matrix multiplication by the negative of the inverse of the T (block 203) matrix with the output of block 307. In an embodiment, block 308 is implemented with back substitution. In another embodiment, block 308 is implemented with matrix multiplication. In other embodiments, other methods can be used such as iterative matrix inversion.

Circuit 300, the parallel RU encoder, is able to compute the parity values in V cycles where V is the number of pipelining cutsets (K. K. Parhi, *VLSI Digital Signal Processing Systems Design and Implementation*, John Wiley & Sons, 1999). The parallel RU encoder computes the parity values with seven matrix multiplications of varying sizes, which are significantly faster than the G matrix multiplication, and two additions. The primary advantage of the RU encoder is that it takes advantage of the sparseness of the H matrix to minimize area overhead. Unfortunately, there is no simple relationship between columns and folding or time-multiplexing technique (K. K. Parhi, *VLSI Digital Signal Processing Systems: Design and Implementation*, John Wiley & Sons, 1999) is unable to take advantage of the sparseness. The RU encoder has several disadvantages: 1) it has long routing overhead, 2) long critical path, 3) multiple steps which cannot be folded, and 4) dependencies which stall computations. Although pipelining can solve problem 2) the other problems cannot be easily fixed.

The last two encoder designs suffered from several problems. First the partially parallel G matrix encoder required significant storage overhead and power requirements due to large number of memory values which need to be read per cycle which makes it less ideal for implementation. The RU Method suffered from a long critical path, inability to be easily implemented as a partially parallel design, and odd constraints which lead to a non-systematic encoder. Therefore the next method, which is the proposed invention, is an improvement over these two methods. This method is the low complexity Hybrid encoder which requires significantly less storage and maintains a systematic encoder form as in FIG. 4.

Figure 4:
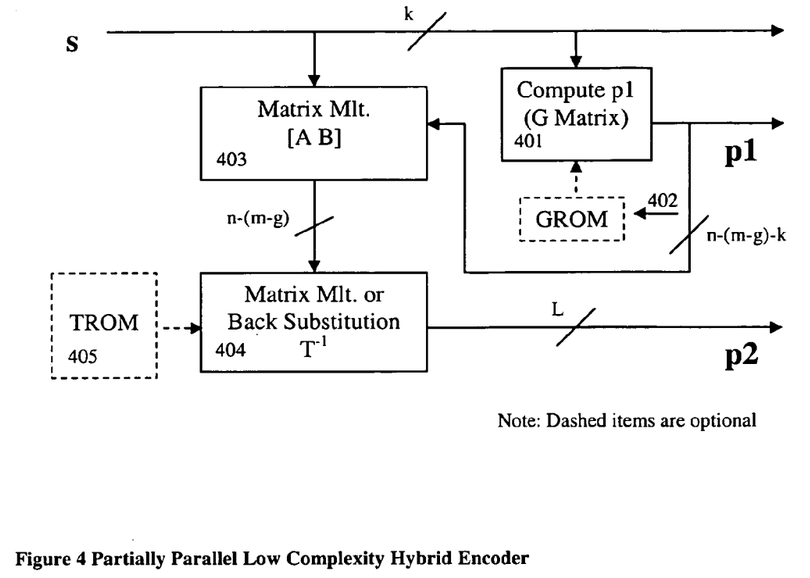
FIG. 4. illustrates the low complexity partially parallel Hybrid encoder for block codes.

FIG. 4 illustrates circuit 400 the partially parallel low complexity Hybrid encoder. Circuit 400 consists of blocks 401, 402, 403, 404, and 405. Block 401 computes the first parity values based on the G matrix. In an embodiment, block 401 is implemented as a fully parallel matrix multiplication. In another embodiment, block 401 is implemented as a partially parallel matrix multiplication. In other embodiments, other methods are used. Block 402 stores a select portion of the G matrix coefficients. Block 402 is optional. In an embodiment, block 402 is implemented as read only memory (ROM). In another embodiment, block 402 is implemented as random access memory (RAM). In other embodiments, other devices are used. Block 403 is a matrix multiplication of [A B] (blocks 201 and 202) with the input S and the output of block 401 (the first set of parity values (P)). In an embodiment, block 403 is implemented as a fully parallel matrix multiplication. In other embodiments, other methods are used. Block 404 is a matrix multiplication by the inverse of block 203 (T). In an embodiment, block 404 is implemented as a fully parallel matrix multiplication. In another embodiment, block 404 is implemented as a partially parallel matrix multiplication. In another embodiment block 404 is implemented as a fully parallel back substitution. In another embodiment block 404 is implemented as a partially parallel back substitution. In other embodiments, other methods are used. Block 405 is the storage element for the coefficients of (block 203) the T matrix. Block 405 is optional. In an embodiment, block 405 is implemented as a read only memory (ROM). In another embodiment, block 405 is implemented as a random access memory (RAM). In another embodiment, block 405 is implemented as shift registers. In other embodiments, other devices may be used.

The main idea is to compute the p1 values by using the G Matrix. Therefore, one does not need the inverse of the $\Phi$ matrix as in the RU method. This method proposes to compute the $p_1$ values sequentially as in the partially parallel G matrix encoder. However, instead of using the G matrix to compute $p_2$ values this method uses the special property $(p_2^T = -T^{-1}(As^T + Bp_1^T))$ from the RU method to compute $p_2$ using a parallel sparse matrix multiplication ([A B]*[s $p_1]^T = As^T + Bp_1^T$) and a sequential back substitution (or matrix multiplication) computation. This has two advantages. First this method has a shorter critical path when the back substitution is implemented in an L-parallel fashion with small L and second the memory storage requirements can be significantly reduced because T is lower triangular and much smaller than the parity check equations (P) from the G matrix.

Therefore this effectively cuts the memory storage in half when using back substitution versus matrix multiplication.

The following is the mathematical representation of the encoder.

$$p_1^T = s*G(:,k+1:n-(m-g)), \text{ where columns k+1 to } n-(m-g) \text{ are used}$$

$$p_2^T = -T^{-1}(As^T + Bp_1^T)$$

where, k is the number of information values, n is the number of values in the codeword, g is the column and row size of $\Phi$, and m is the number of rows in the H matrix.

The following steps are required to design the Hybrid encoder:

1. Transform the H matrix into approximate lower triangular form as FIG. 2.
2. Perform one of the following to define block (405) coefficients:
   (a) With back substitution perform look-ahead (K. K. Parhi, *VLSI Digital Signal Processing Systems: Design and Implementation*, John Wiley & Sons, 1999) to remove dependencies.
   (b) With matrix multiplication find $T^{-1}$ using Gaussian elimination.

The previous method did not discuss details about efficient partially parallel implementations of the $T^{-1}$ matrix multiplication. Several different methods exist for the $T^{-1}$ matrix multiplication such as the pre-computed $T^{-1}$ folded matrix multiplication which is similar to the partially parallel G matrix encoder. However, this method suffers from increased complexity in storage overhead because the $T^{-1}$ matrix is not lower triangular like the T matrix. Another method is referred to as back substitution which relies on the T matrix. However, it suffers from a long critical path (when implemented in parallel) and intra-cycle dependencies (when folded). Finding a solution which overcomes these problems is important.

Next is an example of back substitution for a 4 bit example. Back substitution is defined as the problem given the equation Ty=x, with values for T and x, find y. The full matrix formula is described by $$\begin{bmatrix} 1 & 0 & 0 & 0 \\ t_{2,1} & 1 & 0 & 0 \\ t_{3,1} & t_{3,2} & 1 & 0 \\ t_{4,1} & t_{4,2} & t_{4,3} & 1 \end{bmatrix} \begin{bmatrix} y_1 \\ y_2 \\ y_3 \\ y_4 \end{bmatrix} = \begin{bmatrix} x_1 \\ x_2 \\ x_3 \\ x_4 \end{bmatrix}.$$

Solving for the $y_i$'s becomes a sequential operation shown below:

$$y_1 = x_1$$

$$y_2 = x_2 \oplus t_{2,1} y_1$$

$$y_3 = x_3 \oplus t_{3,1} y_1 \oplus t_{3,2} y_2$$

$$y_4 = x_4 \oplus t_{4,1} y_1 \oplus t_{4,2} y_2 \oplus t_{4,3} y_3$$

Figure 5:
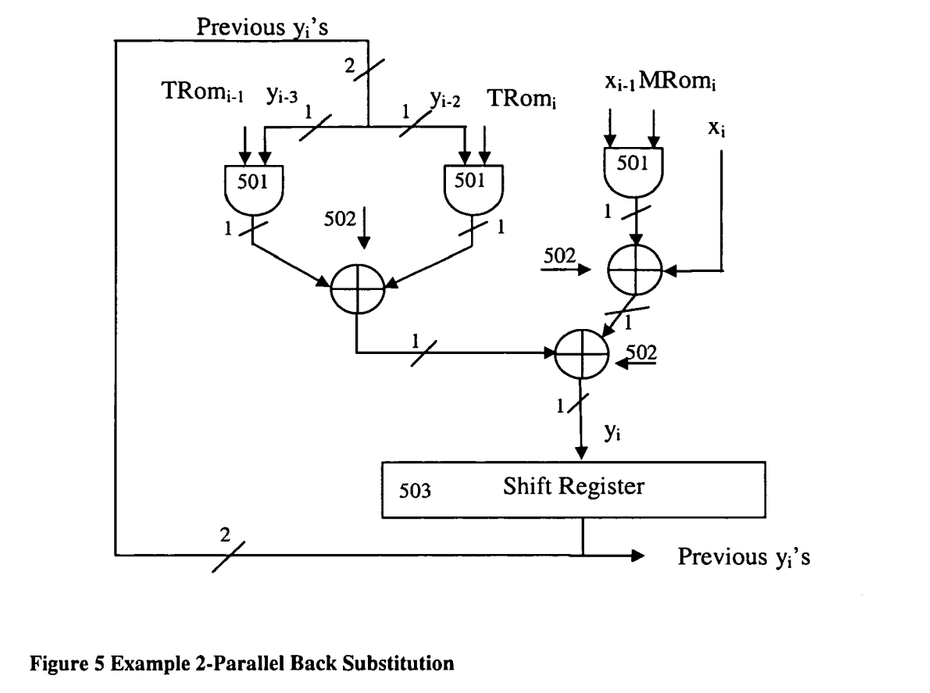
FIG. 5. illustrates an example of 2-Parallel back substitution.

In FIG. 5, the look-ahead technique (K. K. Parhi, *VLSI Digital Signal Processing Systems: Design and Implementation*, John Wiley & Sons, 1999) was applied to provide an example for a 2-parallel back substitution method.

FIG. 5 illustrates circuit 500 the example 2-parallel back substitution method for block code encoders. Circuit 500 consists of blocks 501, 502, and 503. Block 501 performs a multiplication. In an embodiment, block 501 is implemented as logical AND gates. In other embodiments, other devices may be used. Block 502 performs a summing operation. In an embodiment, block 502 is implemented with logical exclusive or gates. In other embodiments other devices may be used. Block 503 performs a shifting operation. In an embodiment, block 503 is implemented by a shift register. In other embodiments, other devices may be used.

Circuit 500 is an efficient implementation of an L-parallel back substitution which reduces the critical path. It produces L parity values per cycle and operates in the ceiling of (rowsize(T)/L) cycles. The primary advantage of this method lies in balanced critical path between the field summation of the $y_i$ values and the field summation of the $x_i$ values. In essence, this method can be considered a partial Gaussian elimination method. This method converts the T matrix into the T' and M matrices. The new matrix M represents the $x_i$ summation tree. The main disadvantage of this method is the additional memory overhead for the M matrix.

An example of the 2-parallel look-ahead technique for back substitution is presented next. Given the following matrix multiplication for Ty=x $$\begin{bmatrix} 1 & 0 & 0 & 0 \\ (1) & 1 & 0 & 0 \\ 1 & 0 & 1 & 0 \\ 1 & 0 & (1) & 1 \end{bmatrix} \begin{bmatrix} y_1 \\ y_2 \\ y_3 \\ y_4 \end{bmatrix} = \begin{bmatrix} x_1 \\ x_2 \\ x_3 \\ x_4 \end{bmatrix},$$

where the dependencies are shown with parentheses applying the look-ahead technique amounts to adding the odd row with the even row to create a new matrix multiplication where additional work has been moved to the right hand side of the equation as seen below $$\begin{bmatrix} 1 & 0 & 0 & 0 \\ 0 & 1 & 0 & 0 \\ 1 & 0 & 1 & 0 \\ 0 & 0 & 0 & 1 \end{bmatrix} \begin{bmatrix} y_1 \\ y_2 \\ y_3 \\ y_4 \end{bmatrix} = \begin{bmatrix} x_1 \\ x_1 + x_2 \\ x_3 \\ x_3 + x_4 \end{bmatrix} = \begin{bmatrix} 1 & 0 \\ \{1\} & 1 \\ 1 & 0 \\ \{1\} & 1 \end{bmatrix} \begin{bmatrix} x_1 \\ x_2 \\ x_3 \\ x_4 \end{bmatrix}.$$

This improvement has come at a cost and now extra coefficient storage is required for the right hand side of the equation. The entries with braces around them correspond to the values which must be stored. Total additional storage overhead to remove the dependencies is defined as the number of lower triangular values times the number of cycles for the encoder.

The following steps are required to design the L-parallel back substitution:

1. Pick a parallelism level for L.
2. Add the L−1 previous rows to each row where (rownum mod L=0)

Figure 6:
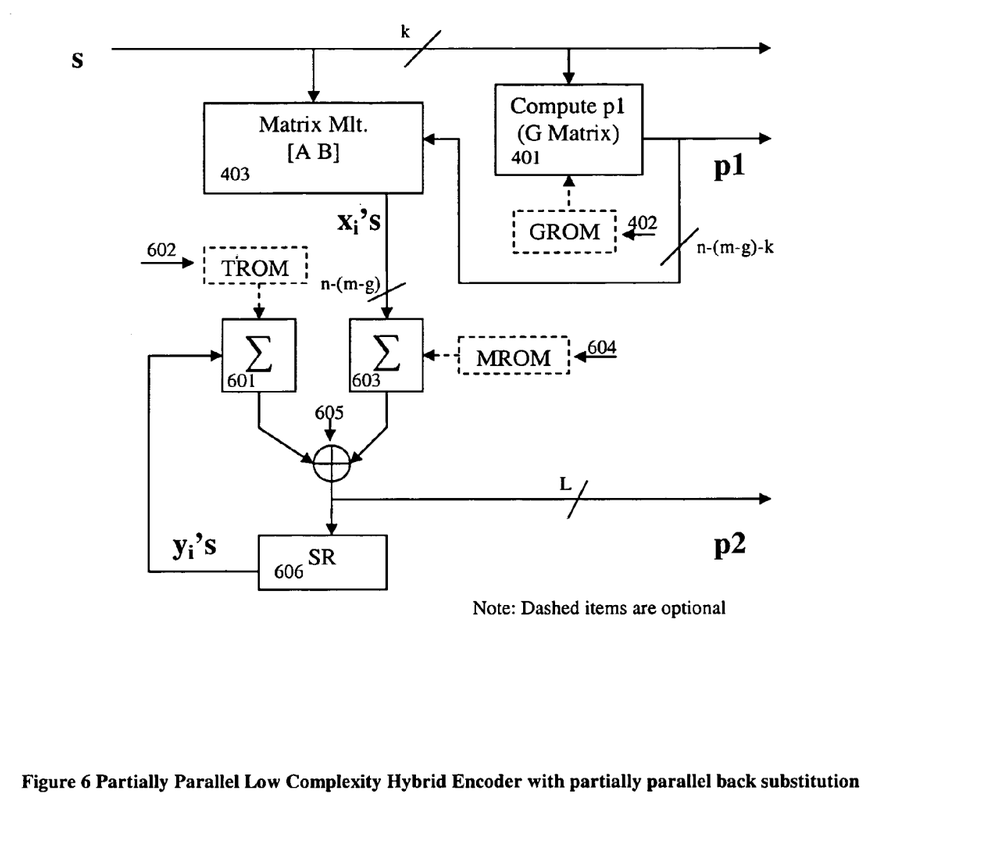
FIG. 6. illustrates the low complexity partially parallel Hybrid encoder with parallel back substitution for block codes.

FIG. 6 illustrates Circuit 600 the partially parallel low complexity Hybrid encoder. Circuit 600 is composed of blocks 401, 402, 403, 601, 602, 603, 604, 605, and 606. Blocks 401 to 403 are identical in functionality to circuit 400. Block 601 is the field summation tree for the $y_i$'s. In an embodiment, block 601 is implemented as adder trees. In another embodiment, block 601 is implemented as a logical exclusive or (XOR) tree. In other embodiments, other devices may be used. Block 602 holds the T' matrix coefficients. In an embodiment, block 602 is implemented as read only memory (ROM). In another embodiment, block 602 is implemented as random access memory (RAM). In another embodiment, block 602 is implemented as shift registers. In other embodiments, other devices may be used. Block 603 is the field summation tree for the $x_i$'s. In an embodiment, block 603 is implemented as adder trees. In another embodiment, block 603 is implemented as a logical exclusive or (XOR) tree. In other embodiments, other devices may be used. Block 604 is holds the M matrix coefficients. In an embodiment, block 604 is implemented as read only memory (ROM). In another embodiment, block 604 is implemented as random access memory (RAM). In another embodiment, block 604 is implemented as shift registers. In other embodiments, other devices may be used. Block 605 is a field addition which combines the results from the $y_i$'s summation and the $x_i$'s summation. In an embodiment, block 605 is implemented with an adder. In another embodiment, block 605 is implemented with a logical exclusive or gate. In other embodiments, other devices may be used. Block 606 is a memory element to store the previous $y_i$ results for the feedback portion of the back substitution. In an embodiment, block 606 is implemented with an L-parallel shift register. In other embodiments, other devices may be used.

What is claimed is:

1. A LDPC block code encoder, comprising:
   a first matrix multiplier coupled to the input information bits and a first memory unit used to generate first set of parity values,
   a second matrix multiplier coupled to the output of the said first matrix multiplier and the input information bits,
   a third matrix multiplier coupled to the output of the second matrix multiplier and a second memory unit used to generate the second set of parity values.

2. The block code encoder of claim 1, wherein said encoder is part of a communications transceiver.

3. The LDPC code encoder of claim 1, wherein the LDPC code is a regular code.

4. The LDPC code encoder of claim 1, wherein the LDPC code is an irregular code.

5. The LDPC block code encoder of claim 1, wherein said matrix multipliers are implemented by a plurality of AND gates and EX-OR (exclusive-or) gates.

6. The LDPC block code encoder of claim 1, wherein the said third matrix multiplier is implemented using back substitution.

7. The LDPC block code encoder of claim 1, where the said third matrix multiplier is implemented using a plurality of binary weighted sums, wherein said binary weighted sums are formed by a plurality of AND gates and EX-OR gates.

8. The LDPC block code encoder of claim 1, wherein the said third matrix multiplier is implemented using an elimination method.

9. An integrated circuit having a substrate and a low density parity check block code encoder comprising:
   a first matrix multiplier coupled to the input information bits and a first memory unit used to generate first set of parity values,
   a second matrix multiplier coupled to the output of the first matrix multiplier and the input information bits,
   a third matrix multiplier coupled to the output of the second matrix multiplier and a second memory unit used to generate the second set of parity values.

10. The integrated circuit of claim 9, wherein the said LDPC block code encoder is part of a communications transceiver.

11. The integrated circuit of claim 9 comprising the block code encoder, wherein the said LDPC code is a regular code.

12. The integrated circuit of claim 9 comprising the LDPC block code encoder, wherein the said LDPC code is an irregular code.

13. The integrated circuit of claim 9 comprising the LDPC block code encoder, wherein the said matrix multipliers are implemented by a plurality of AND gates and EX-OR (exclusive-or) gates.

14. The integrated circuit of claim 9 comprising the LDPC block code encoder, wherein the said third matrix multiplier is implemented using back substitution.

15. The integrated circuit claim 9 comprising the LDPC block code encoder, wherein the said third matrix multiplier is implemented using a plurality of binary weighted sums, wherein said binary weighted sums are formed by a plurality of AND gates and EX-OR gates.

16. The integrated circuit of claim 9 comprising the LDPC block code encoder, wherein the said third matrix multiplier is implemented using an elimination method.

17. A method to implement a LDPC block code encoder, comprising the steps:
   a) converting the H matrix to an upper triangular form,
   b) computing the first set of parity values by a first matrix multiplication,
   c) Computing an intermediate result by a second matrix multiplication,
   d) computing the second set of parity values by using the result of the matrix multiplication in part (c), wherein this step is implemented comprising the sub-steps:
      (i) selecting a method to implement this computation based on either matrix multiplication or back substitution or other elimination methods,
      (ii) selecting a level of parallelism if needed, and
      (iii) applying look-ahead to the method in (i) using the level of parallelism in step (ii) if needed.

* * * * *